(12) United States Patent
Floyd et al.

(10) Patent No.: US 7,413,612 B2
(45) Date of Patent: Aug. 19, 2008

(54) IN SITU SUBSTRATE HOLDER LEVELING METHOD AND APPARATUS

(75) Inventors: Kirby Floyd, San Jose, CA (US);
Adrian Q. Montgomery, San Jose, CA (US); Jennifer Gonzales, Riverside, CA (US); Won Bang, Santa Clara, CA (US); Rong Pan, San Jose, CA (US); Amna Mohammed, Sunnyvale, CA (US); Yen-Kung Victor Wang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 743 days.

(21) Appl. No.: 10/618,187

(22) Filed: Jul. 10, 2003

(65) Prior Publication Data
US 2005/0006556 A1    Jan. 13, 2005

(51) Int. Cl.
*C23C 16/00* (2006.01)
*C23F 1/00* (2006.01)
*H01L 21/306* (2006.01)

(52) U.S. Cl. .................. 118/729; 156/345.54
(58) Field of Classification Search .......... 118/728, 118/729; 156/345.51, 345.54
See application file for complete search history.

(56) References Cited

U.S. PATENT DOCUMENTS

| | | | |
|---|---|---|---|
| 5,543,890 A | * | 8/1996 | Tanaka et al. .............. 355/53 |
| 5,558,717 A | * | 9/1996 | Zhao et al. .................. 118/715 |
| 5,792,269 A | | 8/1998 | Deacon et al. |

* cited by examiner

*Primary Examiner*—Parviz Hassanzadeh
*Assistant Examiner*—Maureen G Arancibia
(74) *Attorney, Agent, or Firm*—Townsend and Townsend and Crew

(57) ABSTRACT

Embodiments of the present invention are directed to adjusting the spacing between the substrate support and the faceplate of the gas distribution member to achieve improved uniformity of the layer formed on the substrate. One embodiment of the present invention is directed to a method of adjusting a spacing between a gas distribution member and a substrate support disposed generally opposite from the gas distribution member, wherein the substrate support is configured to support a substrate on which to form a layer with improved thickness uniformity. The method comprises forming a layer on the substrate disposed on the substrate support; measuring a thickness of the layer on the substrate; and calculating differences in thickness between a reference location on the substrate and a plurality of remaining locations on the substrate. The method further comprises computing spacing adjustment amounts for the remaining locations relative to the reference location based on the differences in thickness between the reference location and the remaining locations. The spacing adjustment amount is positive to increase the spacing between the substrate support at the location and the gas distribution member if the thickness is greater at the location than at the reference location. The spacing adjustment amount is negative to decrease the spacing between the substrate support at the location if the thickness is smaller at the location than at the reference location.

17 Claims, 5 Drawing Sheets

IN SITU SUBSTRATE HOLDER LEVELING METHOD AND APPARATUS

CROSS-REFERENCES TO RELATED APPLICATIONS

NOT APPLICABLE

BACKGROUND OF THE INVENTION

The present invention relates generally to semiconductor manufacturing and, more particularly, to a method and an apparatus for achieving a desired thickness uniformity of a layer formed on a substrate.

One of the primary steps in the fabrication of modern semiconductor devices is the formation of a thin film on a semiconductor substrate by chemical reaction of gases. Such a deposition process is referred to as chemical vapor deposition (CVD). Conventional thermal CVD processes supply reactive gases to the substrate surface where heat-induced chemical reactions can take place to produce the desired film. Plasma enhanced CVD processes promote the excitation and/or dissociation of the reactant gases by the application of radio frequency (RF) energy to the reaction zone proximate the substrate surface thereby creating a plasma of highly reactive species. The high reactivity of the released species reduces the energy required for a chemical reaction to take place, and thus lowers the required temperature for such CVD processes.

The substrate rests on a substrate support during processing in the chamber such as the formation of a layer on the substrate. The substrate support typically is a substrate heater which supports and heats the substrate during substrate processing. The substrate rests above the heater surface of the heater and heat is supplied to the bottom of the substrate. Some substrate heaters are resistively heated, for example, by electrical heating elements such as resistive coils disposed below the heater surface or embedded in a plate having the heater surface. The heat from the substrate heater is the primary source of energy in thermally driven processes such as thermal CVD for depositing layers including undoped silicate glass (USG), doped silicate glass (e.g., borophosphosilicate glass (BPSG)), and the like.

The substrate support typically supports the substrate opposite a gas distribution faceplate through which a reactant gas is supplied to the chamber. The faceplate is part of the gas distribution member for supplying one or more gases to the chamber. The gas flow from the faceplate to the substrate affects the uniformity of the layer formed on the substrate, such as the thickness of the layer.

BRIEF SUMMARY OF THE INVENTION

Embodiments of the present invention are directed to adjusting the spacing between the substrate support and the faceplate of the gas distribution member to achieve improved uniformity of the layer formed on the substrate. The spacing between the substrate support and the faceplate affects the gas flow to the substrate surface and the uniformity of the layer formed on the substrate surface. The spacing between the substrate and the faceplate is typically about 0.2 inch. In some processes, the substrate is placed very close to the faceplate (e.g., spaced by about 0.1 inch or less) to increase film deposition rate. This decrease in spacing renders the film thickness uniformity more sensitive to the uniformity of spacing between the substrate and the faceplate.

One embodiment of the present invention is directed to a method of adjusting a spacing between a gas distribution member and a substrate support disposed generally opposite from the gas distribution member, wherein the substrate support is configured to support a substrate on which to form a layer with improved thickness uniformity. The method comprises forming a layer on the substrate disposed on the substrate support; measuring a thickness of the layer on the substrate; and calculating differences in thickness between a reference location on the substrate and a plurality of remaining locations on the substrate. The method further comprises computing spacing adjustment amounts for the remaining locations relative to the reference location based on the differences in thickness between the reference location and the remaining locations. The spacing adjustment amount is positive to increase the spacing between the substrate support at the location and the gas distribution member if the thickness is greater at the location than at the reference location. The spacing adjustment amount is negative to decrease the spacing between the substrate support at the location if the thickness is smaller at the location than at the reference location.

In accordance with another embodiment of the invention, an apparatus for adjusting a spacing between a gas distribution member and a substrate support comprises a processing chamber including a gas distribution member, and a substrate support disposed in the processing chamber and located generally opposite from the gas distribution member. The substrate support has a substrate support surface configured to support a substrate on which to form a layer. A leveling plate is coupled to the substrate support, the leveling plate including at least three measurement locations to mount a measuring device to measure distances between the leveling plate and a reference surface fixed with respect to the gas distribution member at each of the measurement locations. At least three adjustment members are each coupled between the leveling plate and the reference surface. The at least three adjustment members are disposed at separate adjustment locations distributed over the leveling plate and independently adjustable to change positions of the leveling plate relative to the reference surface, thereby adjusting spacings between the substrate support surface and the gas distribution member at a plurality of corresponding adjustment locations on the substrate support surface to modify a tilt of the substrate support surface with respect to the gas distribution member.

DETAILED DESCRIPTION OF THE INVENTION

Figure 1:
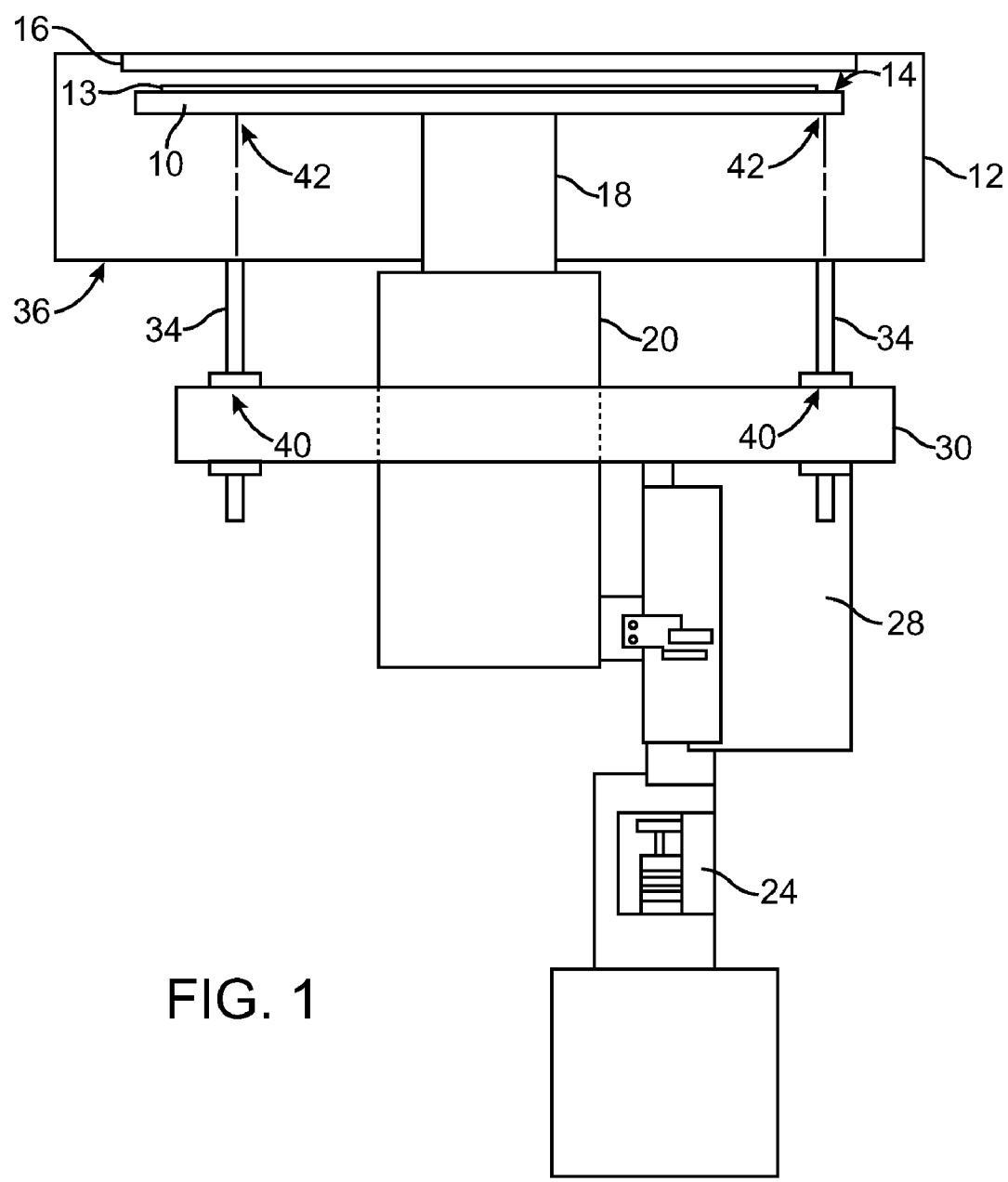
FIG. 1 is a simplified front elevational view of a substrate support showing a height adjustment mechanism according to an embodiment of the present invention.

As shown in FIG. 1, a substrate holder or support 10 is disposed in a processing chamber 12 for processing a substrate 13 to be placed on the substrate support surface 14. A gas distribution member 16, which is typically a faceplate having a plurality of apertures for introducing gases, is disposed generally opposite from the substrate support surface 14. The substrate holder 10 includes a shaft 18 which is supported on a support structure or hub 20 and is slidable with respect to the hub 20 to adjust the spacing between the substrate holder surface 14 and the faceplate 16. The hub 20 is disposed outside of the chamber 12. The shaft 18 is movable vertically by an actuator 24. The tilt of the substrate holder 10 can be defined by the tilt of the hub 20 due to the connection therebetween. The hub 20 is connected to a bracket 28, which is mounted to a leveling member or leveling plate 30. Adjustment of the tilt of the substrate holder 10 is made by adjusting the tilt of the leveling plate 30.

The leveling plate 30 is disposed generally parallel to the substrate support surface 14. At least three adjustment members 34 are coupled between the leveling plate 30 and a reference surface 36. In the embodiment shown, the reference surface 36 is the bottom surface 36 of the chamber 12, but it may be some other surface that is fixed with respect to the faceplate 16. The reference surface 36 may be generally parallel to the faceplate 16. The adjustment members 34 are connected to the leveling plate 30 at a plurality of adjustment locations 40 distributed over the leveling plate 30. The adjustment members 34 are independently adjustable to change the spacings between the leveling plate 30 and the reference surface 36 at the adjustment locations 40. This in turn alters the spacings between the substrate support surface 14 and the faceplate 16 at a plurality of corresponding adjustment locations 42, thereby adjusting the tilt of the substrate support surface 14 with respect to the faceplate 16. In the embodiment of FIG. 1, the corresponding adjustment locations 42 of the substrate support surface 14 are generally aligned with the adjustment locations 40 of the leveling plate 30, since the leveling plate 30 is generally parallel to the substrate support surface 14. In specific embodiments, the corresponding adjustment locations 42 are uniformly distributed around the substrate support surface 14 with respect to the center of the support surface 14.

Figure 2:
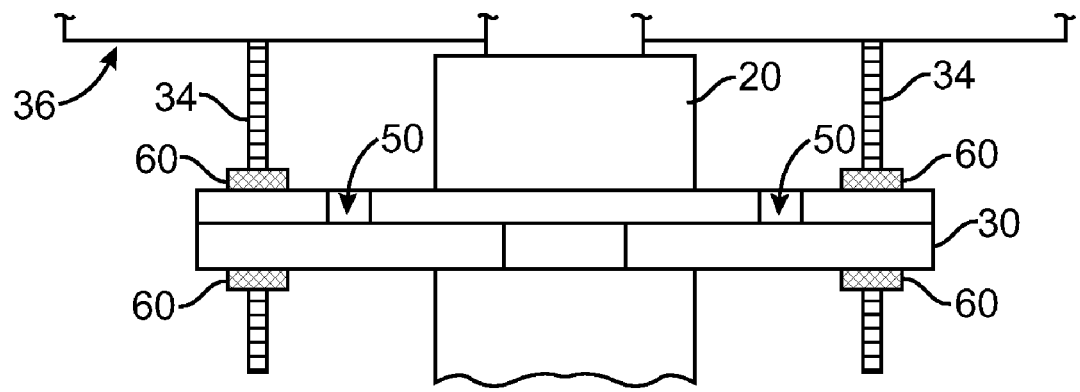
FIG. 2 is a side elevational view of a portion of the height adjustment mechanism of FIG. 1 showing slots for a micrometer.
Figure 3:
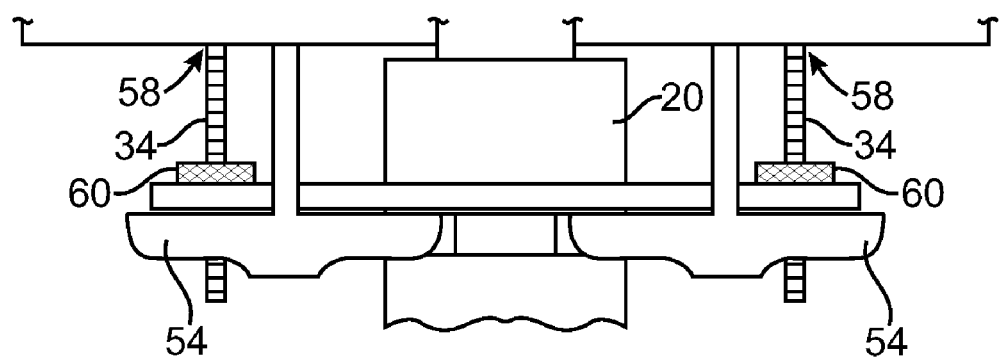
FIG. 3 is a side elevational view of a portion of the height adjustment mechanism of FIG. 1 showing the use of a micrometer for measuring height adjustments.

As more clearly seen in FIG. 2, the leveling plate 30 includes a plurality of measurement locations 50 for mounting measurement devices to measure the spacings between the leveling plate 30 and the reference surface 36. As illustrated in FIGS. 2 and 3, the measurement locations 50 include slots for mounting measurement devices 54 which may be micrometers. The micrometers 54 may be temporarily mounted at the measurement locations 50 when the leveling plate 30 is adjusted, and be removed after the adjustments are made. Typically, each measurement location 50 has a corresponding adjustment location 40, and each measurement location 50 is disposed in close proximity or adjacent to the corresponding adjustment location 40. For instance, the distance between each measurement location 50 and the corresponding adjustment location 40 is substantially less than the diameter of the substrate 13 (e.g., less than about 10% of the diameter of the substrate). In alternate embodiments, the numbers and proximity of the measurement locations 50 and adjustment locations 40 may vary.

The adjustment members 34 each include adjustment screws threadingly coupled to the leveling plate 30 and having ends 58 that bear against the reference surface 36 of the processing chamber 12. A knurled lock nut 60 is threadingly coupled to each adjustment screw 34 and bears against the bottom surface of the leveling plate 30. Another knurled lock nut 62 may also be provided to be threadingly coupled to the adjustment screw 34 and to bear against the top surface of the leveling plate 30. The knurled lock nuts preferably provide sufficiently fine adjustments to achieve the desired accuracy of tilt adjustment of the leveling plate 30 and hence the substrate support surface 14 (e.g., adjustments on the order of about 4 mil). An Allen wrench or the like may be used to turn the knurled lock nuts for adjustment. Of course, other suitable adjustment mechanisms may be used in alternate embodiments.

Experiments have demonstrated that the deposition rate of the layer on a substrate 13 can be correlated to the spacing between the substrate 13 and the faceplate 16, and hence the uniformity of the thickness of the layer formed on the substrate 13 can be adjusted by changing the tilt of the substrate support surface 14 on which the substrate 13 rests. Experimental results for two sets of tests are shown in FIGS. 4 and 5.

Figure 4:
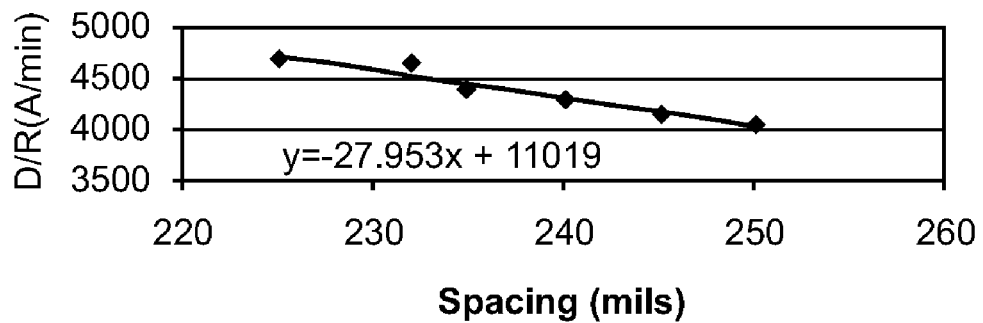
FIG. 4 shows a plot of the deposition rate in thickness per time versus the spacing between the substrate and the faceplate for one semiconductor process.

In FIG. 4, BPSG films were formed on substrates while varying the spacing between the substrate and the faceplate. The films were deposited using He, TEOS, TEB, TEPO as process gases at a temperature of about 550° C. and a pressure of about 200 Torr. FIG. 4 plots the deposition rate in thickness per time (Å/min) versus the spacing (mils). As the spacing increases, the deposition rate decreases by about 27.953 Å/min, which is the slope of the line that is used to compute a correlation factor for the particular process.

Figure 5:
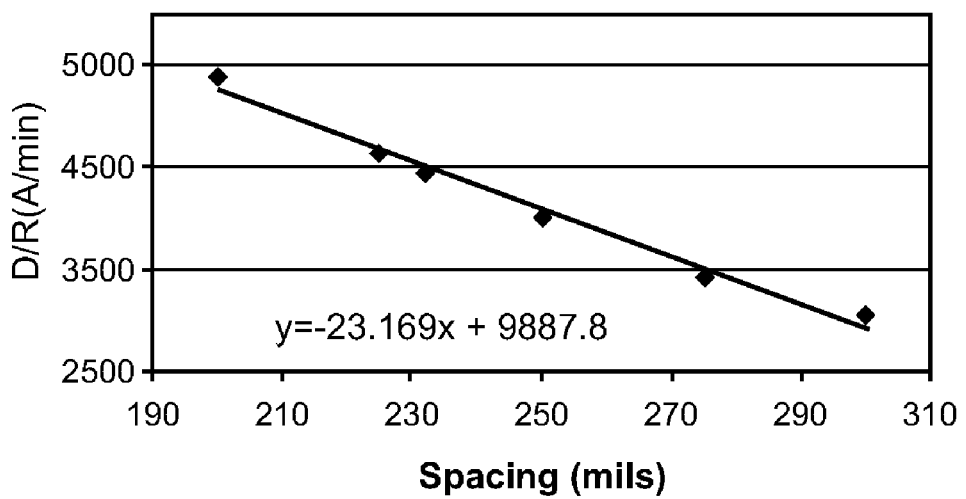
FIG. 5 shows a plot of the deposition rate in thickness per time versus the spacing between the substrate and the faceplate for another semiconductor process.

In FIG. 5, BPSG films were formed on substrates while varying the spacing between the substrate and the faceplate. The films were deposited using He, TEOS, TEB, TEPO as process gases at a temperature of about 550° C. and a pressure of about 200 Torr. As the spacing increases, the deposition rate decreases by about 23.169 Å/min, which is the slope of the line that is used to computer a correlation factor for the particular process. The relatively small difference in the results obtained for FIG. 4 and FIG. 5 may be attributed to the variability of the leveling mechanism, liquid flow variations, fab temperatures, and the like.

A three point counter-tilt procedure will now be described for adjusting the tilt of the substrate support surface to improve uniformity based on the correlation between deposition rate and spacing between the substrate and the faceplate that has been established for the particular type of process involved. As shown in the flow diagram 100 of FIG. 6, a layer is formed on the substrate after positioning the substrate support at a desired spacing from the faceplate (step 102). The thickness of the layer is measured in step 104, which may be done in situ. FIG. 7 shows an example of a thickness map 90 having 49 points to generate a thickness profile of the layer on the substrate. Three points 92, 94, 96 on the substrate correspond in location to the three measurement locations 50 on the leveling plate 30 for making spacing measurements using the micrometers 54 as illustrated in FIG. 3. The three points 92, 94, 96 are typically close to the edge of the substrate, and angularly spaced generally uniformly with respect to the center of the substrate. For example, the three points 92, 94, 96 are spaced about 120° apart with respect to the center of the substrate, and are each spaced from the edge of the substrate by a distance that is less than about 10% of the radius of the substrate.

Figure 6:
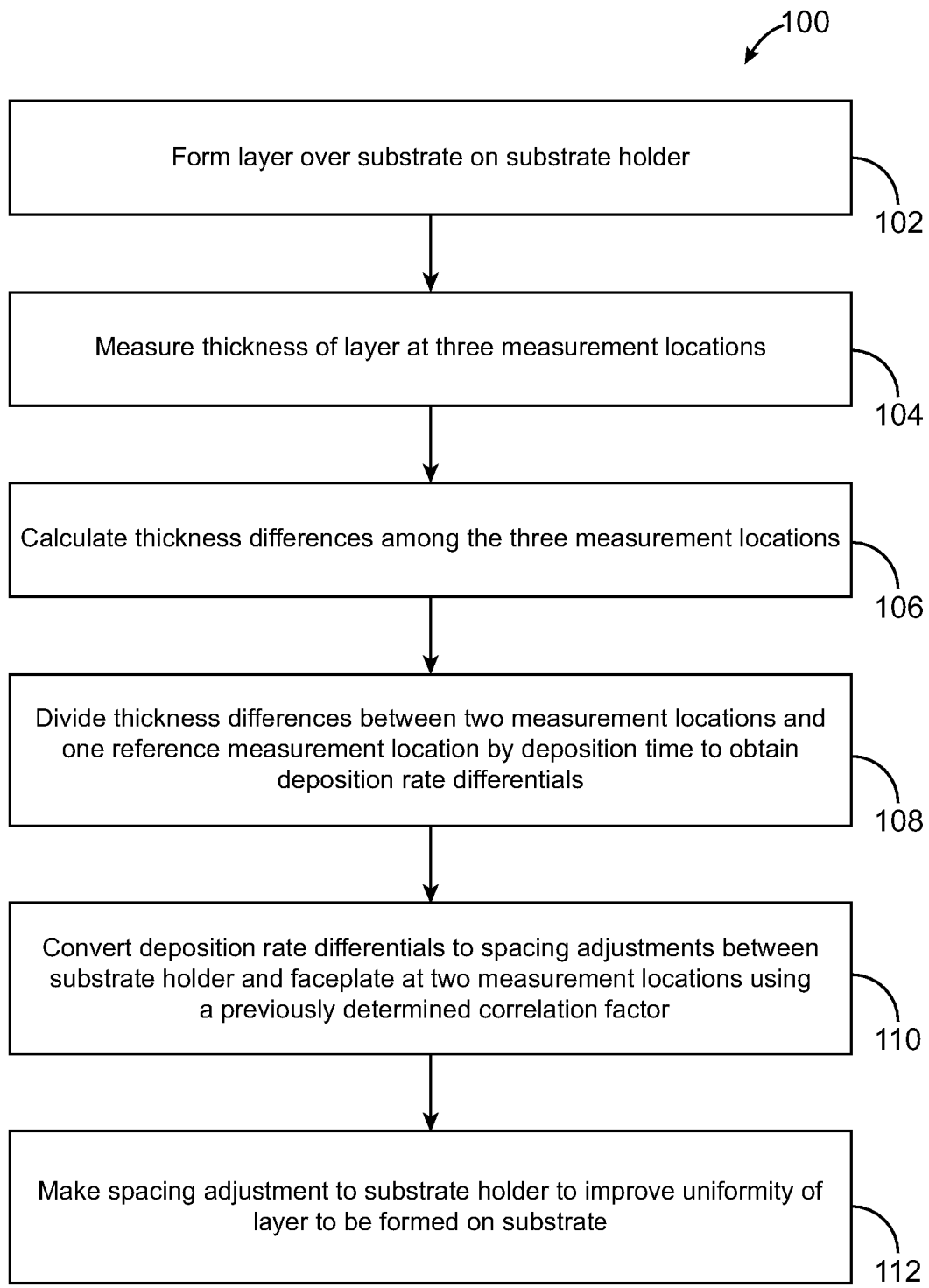
FIG. 6 is a flow diagram of the substrate support leveling method according to an embodiment of the present invention.
Figure 7:
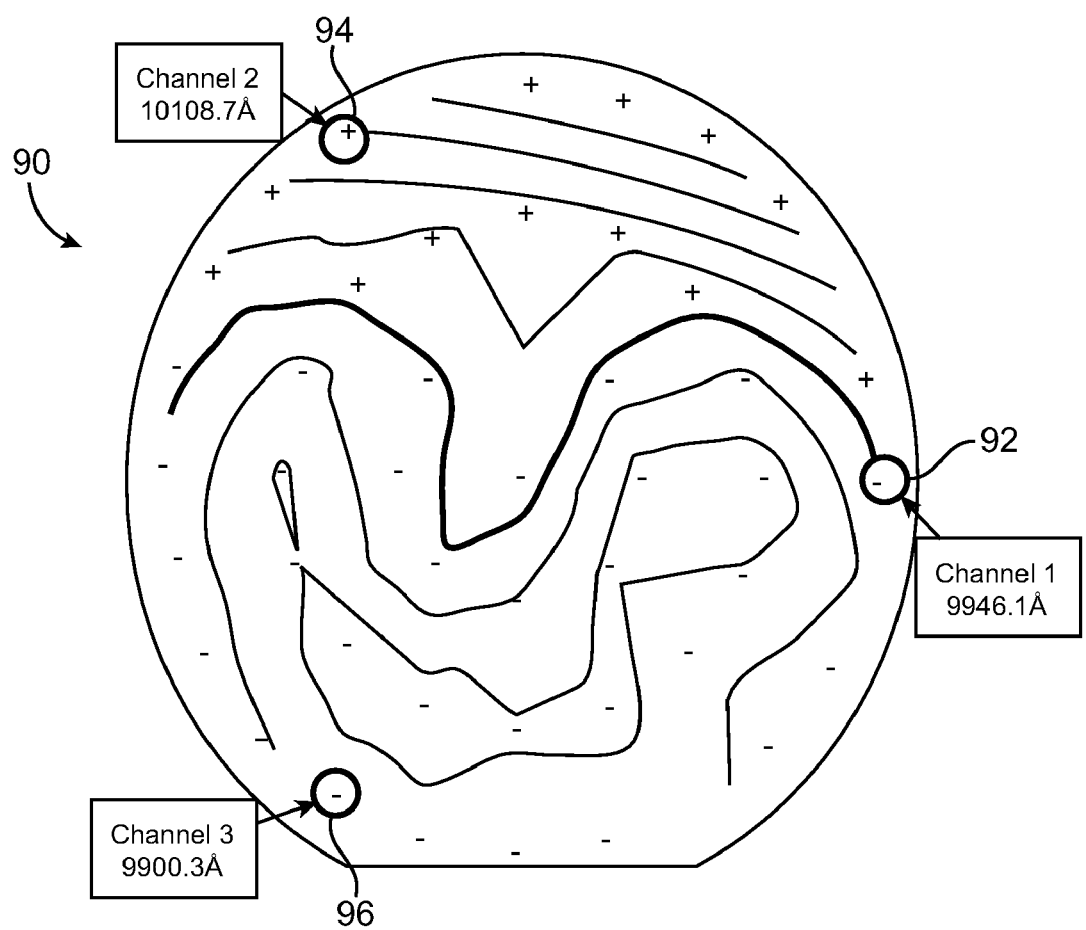
FIG. 7 is a thickness map of a layer formed on the substrate in one example.

Referring to FIG. 6, the next step 106 is to calculate the thickness differences among the three points. For instance, the point 92 is selected as a reference location and the thickness differences are calculated between the reference point 92 and the other points 94, 96 at the remaining locations. In step 108, the thickness differences (between the points 94 and 92 and between the points 96 and 92) are divided by the deposition time to obtain the deposition rate differentials between the reference point 92 and the remaining points 94, 96. A previously determined correlation factor is then used to convert the deposition rate differentials into spacing adjustments at the remaining points 94, 96 to improve the uniformity (step 110). The spacing adjustment is positive to increase the spacing between the substrate support at the remaining point and the faceplate if the thickness is greater at that remaining point than at the reference point 92. Conversely, the spacing adjustment is negative to decrease the spacing between the substrate support at the remaining point and the faceplate if the thickness is smaller at that remaining point than at the reference point 92. In step 112, the spacing adjustments are made, and the substrate support is calibrated for forming layers of improved uniformity for the particular process selected.

The correlation factor is proportional to the slope of a plot of deposition rate versus spacing such as those shown in FIGS. 4 and 5. That is, the correlation factor is proportional to a ratio of change in spacing divided by deposition thickness rate of the layer. Typically, the correlation factor will not be equal to the slope, but will need to be modified to account for the difference between the three point counter-tilt procedure and the spacing adjustments used to obtain the slope of the plot. To obtain the plot, the substrate is moved up or down without tilting. In the three point counter-tilt procedure, however, the spacing at one of the remaining points is adjusted with respect to the reference point to tilt the substrate. Thus, the correlation factor will equal to the slope of the plot multiplied by a correction factor or constant, which may be determined empirically by conducting a number of experiments to determine the correction factor to achieve film thickness uniformity.

Various experiments were conducted to confirm the repeatability of the three point counter-tilt procedure to achieve improvement in thickness uniformity in the layer formed on the substrate for particular semiconductor processes.

The above-described arrangements of apparatus and methods are merely illustrative of applications of the principles of this invention and many other embodiments and modifications may be made without departing from the spirit and scope of the invention as defined in the claims. For instance, the number of measurement locations may be more than three. The scope of the invention should, therefore, be determined not with reference to the above description, but instead should be determined with reference to the appended claims along with their full scope of equivalents.

What is claimed is:

1. An apparatus for adjusting a spacing between a gas distribution member and a substrate, the apparatus comprising:
  a processing chamber including the gas distribution member;
  a substrate support disposed in the processing chamber and located generally opposite from the gas distribution member, the substrate support having a substrate support surface configured to support the substrate on which to form a layer;
  a leveling plate coupled to the substrate support, the leveling plate including at least three measurement locations to mount a measuring device to measure distances between the leveling plate and a reference surface fixed with respect to the gas distribution member at each of the measurement locations, each of the at least three measurement locations including an aperture in the leveling plate, the aperture configured for insertion of the measuring device; and
  at least three adjustment members each extending from the leveling plate to the reference surface, each of the at least three adjustment members disposed at separate adjustment locations distributed on the leveling plate and separated from the at least three measurement locations, the at least three adjustment members independently adjustable to change positions of the leveling plate relative to the reference surface and adjust spacings between the substrate support surface and the gas distribution member at a plurality of corresponding adjustment locations on the substrate support surface to modify a tilt of the substrate support surface with respect to the gas distribution member.

2. The apparatus of claim 1 wherein the separate measurement locations are each disposed in proximity to one of the separate adjustment locations.

3. The apparatus of claim 1 wherein the leveling plate includes slots at the at least three measurement locations to temporarily mount the measurement device at each of the measurement locations.

4. The apparatus of claim 1 wherein the adjustment member comprises adjustment screws threadingly coupled to the leveling plate and having ends bearing against the reference surface of the processing chamber; and knurled lock nuts threadingly coupled to the adjustment screws and bearing against a surface of the leveling plate.

5. The apparatus of claim 1 wherein the leveling plate is generally parallel to the substrate support surface, and wherein the plurality of corresponding adjustment locations on the substrate support surface are generally aligned with the separate adjustment locations distributed on the leveling plate.

6. The apparatus of claim 5 wherein the plurality of corresponding adjustment locations on the substrate support surface are uniformly distributed around the substrate support surface with respect to a center of the substrate support surface.

7. The apparatus of claim 1 wherein the reference surface is a bottom surface of the processing chamber.

8. The apparatus of claim 1 wherein the gas distribution member comprises a faceplate and the reference surface is generally parallel to the faceplate.

9. The apparatus of claim 1 wherein the substrate support comprises a diameter and wherein each of the at least three measurement locations is separated from one of the separate adjustment locations by a distance of no more than 10% of the diameter of the substrate support.

10. An apparatus for adjusting a spacing between a gas distribution member and a substrate, the apparatus comprising:
  a processing chamber including the gas distribution member;
  a reference surface fixed with respect to the gas distribution member;
  a substrate support disposed in the processing chamber and located generally opposite from the gas distribution member, the substrate support having a substrate support surface configured to support the substrate on which to form a layer;
  a leveling plate coupled to the substrate support, the leveling plate including at least three measurement apertures and at least three adjustment apertures, the at least three measurement apertures extending through the leveling plate to mount a measuring device to measure distances between the leveling plate and the reference surface, the at least three adjustment apertures extending through the leveling plate, each measurement aperture spaced apart from each adjustment aperture; and at least three adjustment members each extending from the at least three adjustment apertures to the reference surface, the at least three adjustment members independently adjustable to change positions of the leveling plate relative to the reference surface and adjust spacings between the substrate support surface and the gas distribution member to modify a tilt of the substrate support surface with respect to the gas distribution member.

11. The apparatus of claim 10 wherein each of the at least three measurement apertures is disposed in proximity to one of the at least three adjustment apertures.

12. The apparatus of claim 10 wherein the at least three measurement apertures comprise slots to temporarily mount the measurement device at each of the measurement locations.

13. The apparatus of claim 10 wherein the at least three adjustment members comprise adjustment screws threadingly coupled to the leveling plate and having ends bearing against the reference surface of the processing chamber; and knurled lock nuts threadingly coupled to the adjustment screws and bearing against a surface of the leveling plate.

14. The apparatus of claim 10 wherein the leveling plate is generally parallel to the substrate support surface.

15. The apparatus of claim 10 wherein the reference surface is a bottom surface of the processing chamber.

16. The apparatus of claim 10 wherein the gas distribution member comprises a faceplate and the reference surface is generally parallel to the faceplate.

17. The apparatus of claim 10 wherein the substrate support comprises a diameter and wherein each measurement aperture is separated from one of the at least three adjustment apertures by a distance of no more than 10% of the diameter of the substrate support.

* * * * *